(12) United States Patent
Ueno et al.

(10) Patent No.: US 8,501,048 B2
(45) Date of Patent: Aug. 6, 2013

(54) METAL-GRAPHITE COMPOSITE MATERIAL HAVING HIGH THERMAL CONDUCTIVITY AND PRODUCTION METHOD THEREFOR

(75) Inventors: Toshiyuki Ueno, Matsue (JP); Takashi Yoshioka, Matsue (JP)

(73) Assignee: Shimane Prefectural Government, Matsue (JP)

( * ) Notice: Subject to any disclaimer, the term of this patent is extended or adjusted under 35 U.S.C. 154(b) by 539 days.

(21) Appl. No.: 12/734,029

(22) PCT Filed: Oct. 14, 2008

(86) PCT No.: PCT/JP2008/068557
§ 371 (c)(1),
(2), (4) Date: Apr. 6, 2010

(87) PCT Pub. No.: WO2009/051094
PCT Pub. Date: Apr. 23, 2009

(65) Prior Publication Data
US 2010/0207055 A1  Aug. 19, 2010

(30) Foreign Application Priority Data
Oct. 18, 2007 (JP) ................ 2007-271660

(51) Int. Cl.
*H01B 1/04* (2006.01)
*H01B 1/22* (2006.01)
*H01B 1/02* (2006.01)
*B22F 3/15* (2006.01)
*B22F 3/10* (2006.01)

(52) U.S. Cl.
USPC ........ 252/503; 252/512; 252/518.1; 252/502; 419/49; 419/53; 419/55; 419/10; 419/11; 419/23; 419/34; 419/38; 419/48

(58) Field of Classification Search
USPC ..... 252/70, 71, 502, 503, 512, 518.1; 419/10, 419/11, 23, 34, 38, 48, 49, 53, 55
See application file for complete search history.

(56) References Cited

U.S. PATENT DOCUMENTS 4,602,954 A    7/1986  Davies et al.
4,961,902 A *  10/1990 Clere et al. ............. 419/12
(Continued)

FOREIGN PATENT DOCUMENTS

EP  0 162 555 A1  11/1985
EP  1 820 870 A1  8/2007
(Continued)

OTHER PUBLICATIONS

Adams et al.; "Characterization of High Thermal Conductivity Carbon Fibers and a Self-Reinforced Graphite Panel;" *Carbon*; 1998; pp. 233-245; vol. 36, No. 3; Elsevier Science Ltd.; Great Britain.

(Continued)

*Primary Examiner* — Peter F Godenschwager
*Assistant Examiner* — Jane L Stanley
(74) *Attorney, Agent, or Firm* — Oliff & Berridge, PLC

(57) ABSTRACT

The present invention provides a metal-graphite composite material favorable to two-dimensional diffusion of heat and having a high thermal conductivity in two axial directions, and a production method therefor. The metal-graphite composite material of the present invention includes: 20 to 80% by volume of a scaly graphite powder; and a matrix selected from the group consisting of copper, aluminum and alloys thereof, wherein the scaly graphite powder in which a normal vector to a scaly surface thereof is tilted at 20° or higher with respect to a normal vector to a readily heat-conducting surface of the metal-graphite composite material is 15% or less relative to a whole amount of the scaly graphite powder, and the metal-graphite composite material has a relative density of 95% or higher.

19 Claims, 8 Drawing Sheets

U.S. PATENT DOCUMENTS

| | | | |
|---|---|---|---|
| 5,531,943 A * | 7/1996 | Sudani et al. | 264/29.1 |
| 5,766,765 A * | 6/1998 | Inoue et al. | 428/408 |
| 5,789,842 A | 8/1998 | Steinbach et al. | |
| 5,824,923 A * | 10/1998 | Kondoh et al. | 75/247 |
| 5,863,467 A * | 1/1999 | Mariner et al. | 252/511 |
| 6,355,340 B1 * | 3/2002 | Singh et al. | 428/312.8 |
| 6,564,059 B1 * | 5/2003 | Cyr et al. | 455/445 |
| 6,576,070 B2 | 6/2003 | Kanaoka | |
| 6,888,661 B1 * | 5/2005 | Islam et al. | 359/260 |
| 6,899,160 B2 * | 5/2005 | McCullough | 164/303 |
| 7,115,221 B1 * | 10/2006 | Spahr et al. | 264/15 |
| 7,902,275 B2 * | 3/2011 | Gerhardt et al. | 524/1 |
| 7,923,103 B2 * | 4/2011 | Fukushima | 428/312.8 |
| 8,043,703 B2 * | 10/2011 | Cornie et al. | 428/408 |
| 2001/0052373 A1 | 12/2001 | Kanaoka | |
| 2005/0152806 A1 * | 7/2005 | Dunmead et al. | 419/49 |
| 2009/0035562 A1 * | 2/2009 | Fukushima | 428/337 |
| 2009/0075120 A1 * | 3/2009 | Cornie et al. | 428/698 |
| 2010/0187468 A1 * | 7/2010 | Zimmermann | 252/74 |

FOREIGN PATENT DOCUMENTS

| | | |
|---|---|---|
| JP | A-60-230904 | 11/1985 |
| JP | A-7-207253 | 8/1995 |
| JP | A-8-331811 | 12/1996 |
| JP | A-9-222143 | 8/1997 |
| JP | A-2001-354951 | 12/2001 |
| JP | A-2004-300485 | 10/2004 |
| WO | WO 2006103798 A1 * | 10/2006 |

OTHER PUBLICATIONS

International Search Report mailed on Jan. 27, 2009 in corresponding International Application No. PCT/JP2008/068557.

International Preliminary Report on Patentability dated Aug. 31, 2009 in corresponding International Application No. PCT/JP2008/068557 (with translation).

Dec. 14, 2012 Supplementary European Search Report issued in European Application No. 08839705.4.

Jan. 30, 2013 Supplementary European Search Report issued in European Application No. 08839705.4.

* cited by examiner

METAL-GRAPHITE COMPOSITE MATERIAL HAVING HIGH THERMAL CONDUCTIVITY AND PRODUCTION METHOD THEREFOR

TECHNICAL FIELD

The present invention relates to a metal-graphite composite material having a high thermal conductivity and a production method therefor. More specifically, the present invention relates to a metal-graphite composite material having a high thermal conductivity in two axial directions and being suitable for cooling semiconductor devices and the like that need efficient heat dissipation, and to a production method therefor.

BACKGROUND ART

A material for heat dissipating parts of semiconductor devices is required to have a higher thermal conductivity. Moreover, in order to prevent the connection from being thermally broken down by thermal expansion and contraction, such a material is required to have a thermal expansion coefficient equivalent to that of a semiconductor material that is a heat source. Furthermore, in application to portable semiconductor devices, more emphasis is placed on lightness in weight.

In recent years, for the above purposes, a composite material using a graphitic carbon fiber has attracted attention as a material having a higher thermal conductivity, lower thermal expansion coefficient and lower density than metal. For example, attention has been focused on composite materials using a graphitic carbon fiber having a random structure represented by a polyacrylonitrile (PAN)-based carbon fiber, a graphitic carbon fiber having a radial structure represented by a pitch-based carbon fiber, and a graphitic carbon fiber having a tubular structure represented by a vapor grown carbon fiber (VGCF).

However, the high thermal conductivity of graphite is exhibited in a direction parallel to a hexagonal network structure (graphite structure) composed of carbon atoms in the crystalline structure. Meanwhile, the thermal conductivity of graphite is low in a direction which crosses or is perpendicular to the graphite structure (in a direction which goes through the hexagonal network). In any of the aforementioned graphitic carbon fibers, the graphite structure develops in a length direction of fiber. Accordingly, a high thermal conductivity is obtained in the length direction of the graphitic carbon fiber. Nevertheless, in a thickness direction of fiber, any of the fibers has portions which cross or are perpendicular to the graphite structure. For this reason, the thermal conductivity in the thickness direction of the fiber is low compared with that in the length direction of the fiber.

Recently, with the advancement in semiconductor miniaturization, studies has been conducted on a structure in which heat generated from a semiconductor is dissipated from a large heat dissipation area by diffusing the heat two-dimensionally, instead of a structure in which the heat is transmitted in one direction and then dissipated in a region different from the region where the heat is generated. Such a structure has been studied particularly for notebook PCs, portable communication devices, and the like, in which locally high temperatures are not favorable.

On the other hand, the composite material using a graphitic carbon fiber is unsuitable for diffusing heat two-dimensionally due to the anisotropy of the thermal conductivity of the carbon fiber used therefor. Except for a case where the carbon fiber is aligned in one axial direction, the currently-achieved highest thermal conductivity of the composite material is lower than that of silver which is a metal having the highest thermal conductivity (thermal conductivity=approximately 430 W/m/K).

Meanwhile, a graphite scaly powder has drawn attention due to its high self-lubricity, and its composite material made particularly with copper is widely used in sliding components of a brush for direct current motor and the like (see Patent Citations 1 and 2). In these sliding components, dispersibility of a graphite powder into metal gains importance to efficiently exhibit the self-lubricity. Few studies have been made on the thermal conductivity and the orientation of the graphite powder to obtain a high thermal conductivity. Moreover, when these components are manufactured, a pressureless sintering method is widely adopted. No application of pressure during sintering and low affinity between copper and the surface of graphite result in that these materials are contained at low density.

Moreover, there has been also studied a method to obtain a composite material for a sliding component by sintering a mixture including a flattened copper powder in addition to a graphite scaly powder and spherical copper particles (see Patent Citation 3). However, the use amount of the flattened copper powder is up to 40% by weight relative to the whole amount of copper. Additionally, the flattened copper powder is used to segregate copper on the surface of the composite material for the sliding component. The resultant orientation of the graphite scaly powder is not mentioned at all.

Patent Citation 1: Japanese Patent Laid-Open No. H07-207253 (1995)
Patent Citation 2: Japanese Patent Laid-Open No. H08-331811 (1996)
Patent Citation 3: Japanese Patent Laid-Open No. 2004-300485
Non-Patent Citation 1: P. M. Adams, H. A. Katzman, G. S. Renick and G. W. Stupian, "CHARACTERIZATION OF HIGH THERMAL CONDUCTIVITY CARBON FIBERS AND A SELF-REINFORCED GRAPHITE PANEL", Carbon, Vol. 36, No. 3, pp. 233-245 (1998)

DISCLOSURE OF THE INVENTION

Technical Problem

An object of the present invention is to provide a metal-graphite composite material favorable to two-dimensional diffusion of heat and having a high thermal conductivity in two axial directions, and a production method therefor.

Technical Solution

A metal-graphite composite material of the first embodiment of the present invention comprises: 20 to 80% by volume of a scaly graphite powder; and a matrix selected from the group consisting of copper, aluminium and alloys thereof, wherein the scaly graphite powder in which a normal vector to a scaly surface is tilted at 20° or higher with respect to a normal vector to a readily heat-conducting surface of the metal-graphite composite material is 15% or less relative to a whole amount of the scaly graphite powder, and the metal-graphite composite material has a relative density of 95% or higher. In this embodiment, the scaly graphite powder preferably has a $d_{002}$ value of a graphite crystal in a range of 0.3345 nm to 0.3360 nm, as measured by X-ray diffraction (XRD). Moreover, the scaly graphite powder preferably has an average aspect ratio of 10 to 100 and/or an average particle size of 50 μm to 1000 μm. Furthermore, the metal-graphite composite material of this embodiment may further include a carbon fiber or a carbon nanofiber.

A production method for a metal-graphite composite material of the second embodiment of the present invention comprises the steps of:

(1) obtaining a powder mixture by mixing a scaly graphite powder with a scaly powder of a matrix selected from the group consisting of copper, aluminium and alloys thereof;

(2) forming a sintering precursor by use of the powder mixture; and (3) sintering the sintering precursor with uniaxial pressing being performed, wherein the scaly graphite powder accounts for 20 to 80% by volume of the metal-graphite composite material, the metal-graphite composite material has a relative density of 95% or higher, and a ratio of the scaly graphite powder in which a normal vector to a scaly surface is tilted at 20° or higher with respect to a direction vector of the uniaxial pressing in step (3) is 15% or less relative to a whole amount of the scaly graphite powder. This embodiment also includes the metal-graphite composite material produced by the foregoing method. Here, the scaly graphite powder preferably has a $d_{002}$ value of a graphite crystal in a range of 0.3345 nm to 0.3360 nm as measured by X-ray diffraction. Moreover, the scaly graphite powder preferably has an average aspect ratio of 10 to 100 and/or an average particle size of 50 μm to 1000 μm. Furthermore, the metal-graphite composite material of this embodiment may further include a carbon fiber or a carbon nanofiber.

Furthermore, in order to form a sintering precursor by compacting a powder mixture, step (2) may be performed by repeating steps of:

(2a) filling the powder mixture into a mold; and
(2b) uniaxially pressing the powder mixture thus filled.

Here, a thickness, in a direction of the uniaxial pressing in step (2b), of the sintering precursor obtained by a single sequence of steps (2a) and (2b) needs to be 5 mm or smaller.

Alternatively, in order to form the sintering precursor from the power mixture through the slurry, step (2) of the second embodiment may include steps of:

(2c) forming a slurry by mixing the powder mixture with a liquid medium;

(2d) spreading the slurry on a substrate by a doctor blade method; and (2e) removing the liquid medium therefrom.

Here, a thickness of a sintering precursor obtained through steps (2c) to (2e) needs to be 5 mm or smaller.

ADVANTAGEOUS EFFECTS

With adopting the above-described configuration, the metal-graphite composite material according to the present invention has a higher thermal conductivity in two axial directions than a generally-used metal material. Thus, by transferring heat two-dimensionally with diffusion thereof being performed, heat of devices requiring cooling can be cooled efficiently. Moreover, having a low thermal expansion coefficient, the metal-graphite composite material according to the present invention is capable of achieving a highly reliable bonding state as a cooling member for semiconductors such as Si which have a lower thermal expansion coefficient than a metal material.

BEST MODE FOR CARRYING OUT THE INVENTION

Figure 1:
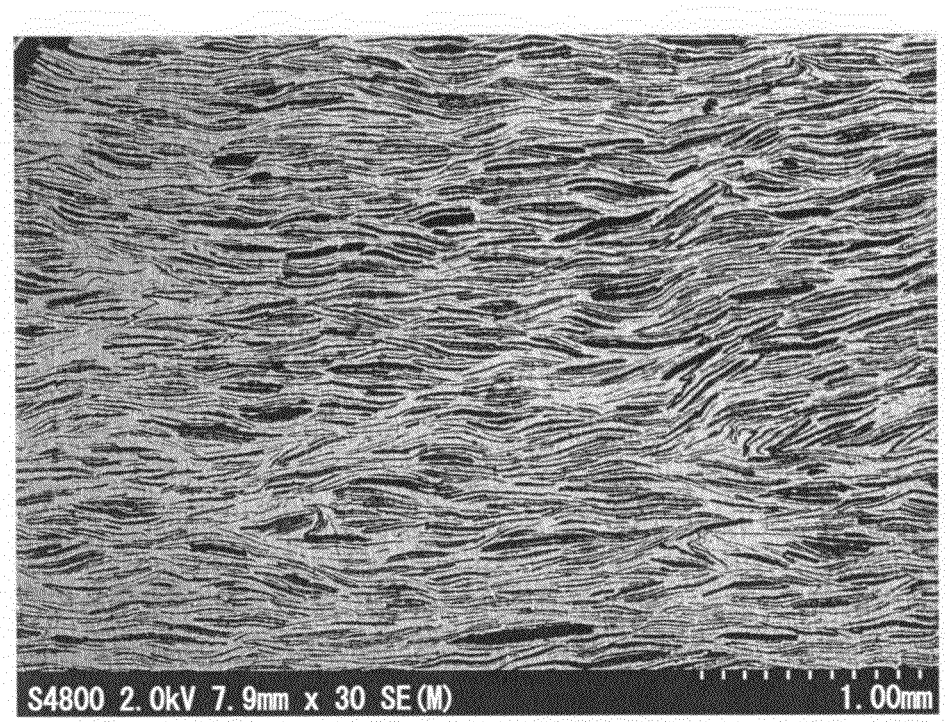
FIG. 1 is a view showing a photograph of a sectional structure of a composite material obtained in Example 1.

A metal-graphite composite material of the first embodiment of the present invention comprises a scaly graphite powder and a matrix and has a relative density of 95% or higher. The relative density in the present invention means a ratio of an actual density to the ideal density calculated from the volume percents and true densities of the scaly graphite powder and the matrix. The relative density is calculated from equations below:

(Relative density)=(actual density)/(ideal density)

(Ideal density)=(true density of scaly graphite powder)×(volume percent of scaly graphite powder)/100+(true density of matrix)×(volume percent of matrix)/100.

The relative density of 95% or higher ensures that few voids which inhibit thermal conduction are present in the composite material, and enables improvement in properties such as mechanical strength.

The scaly graphite powder used in the present invention desirably has a high crystallinity. Desirably, the $d_{002}$ value of the scaly graphite powder is in the range of 0.3345 to 0.3360 nm. The $d_{002}$ value is determined by the XRD Gakushin method, and is an amount corresponding to an interval between graphite surfaces in the graphite powder, and the ideal value is 0.3345 nm. However, in an ordinary case, the $d_{002}$ value is a value greater than the ideal value of 0.3345 nm due to the irregularities in crystals, and the like. The scaly graphite powder having a high crystallinity has a high thermal conductivity in a direction of a scaly surface (that is, directions of two axes perpendicular to each other). A particle having a $d_{002}$ value in the above-described range has a thermal conductivity in the range of 1000 to 2000 W/m/K (see Non-Patent Citation 1).

The scaly graphite powder used in the present invention has an average aspect ratio of 10 to 100, and preferably 30 to 100. The average aspect ratio in the present invention means an average of ratios of the representative lengths of scaly surfaces to the thicknesses of the particles. Moreover, the scaly graphite powder used in the present invention has an average particle size of 50 μm to 1000 μm, and preferably 80 μm to 500 μm. The average particle size in the present invention means an average of a representative length of each scaly surface of the powder.

Although not essential, particularly when aluminium or an alloy thereof is used as the matrix, a coating may be applied on a surface of the scaly graphite powder to improve the affinity of the graphite powder with the matrix. Thereby, the mechanical strength and the like of the composite material to be obtained can be improved.

The matrix in this embodiment is copper, aluminium or an alloy thereof. As will be described below in the second embodiment, the matrix is prepared by pressure sintering a scaly powder. From the viewpoint of increasing the thermal conductivity, a pure metal of copper or aluminium is preferably used. Nevertheless, when it is necessary to consider improvement in other properties such as mechanical strength or thermal expansion coefficient, or improvement in the production efficiency, a copper alloy or an aluminium alloy can be used.

The metal-graphite composite material of this embodiment is produced, as will be described below in the second embodiment, by pressure sintering the scaly graphite powder and a scaly powder for forming the matrix. During this process, a normal vector to the scaly surface of the scaly graphite powder is aligned in a pressurizing direction (that is, aligned in a Z direction). Thus, the scaly surface of the scaly graphite powder is aligned perpendicularly to the pressurizing direction (that is, aligned in an XY plane), thereby forming a readily heat-conducting surface. In the metal-graphite composite material of this embodiment, it is important that the scaly graphite powder in which the normal vector to the scaly surface thereof is tilted at 20° or higher with respect to a normal vector to the readily heat-conducting surface (that is, a direction vector of the pressurizing direction) be 15% or less relative to the whole amount of the scaly graphite powder. This is because even a small amount of the scaly graphite powder in which the normal vector to the scaly surface thereof is tilted at 20° or higher inhibits the formation of the readily heat-conducting surface by the alignment of the scaly surface, and lowers the thermal conductivity in the readily heat-conducting surface.

The metal-graphite composite material of this embodiment includes 20 to 80% by volume of the scaly graphite powder and 80 to 20% by volume of the matrix. With such ranges of the volume ratios achieved, a high thermal conductivity and a low thermal expansion coefficient in the readily heat-conducting surface can be satisfied simultaneously. Moreover, the metal-graphite composite material of this embodiment may further include a carbon fiber or a carbon nanofiber.

A production method for a metal-graphite composite material of the second embodiment of the present invention includes the steps of:

(1) obtaining a powder mixture by mixing a scaly graphite powder with a scaly powder of a matrix selected from the group consisting of copper, aluminium and alloys thereof;

(2) forming a sintering precursor by use of the powder mixture; and (3) sintering the sintering precursor with uniaxial pressing being performed.

The scaly powder of the matrix used in step (1) can be prepared from aluminium, copper, or an alloy based thereon. The scaly powder of the matrix has an average aspect ratio of 10 to 100, and preferably 30 to 100. The average particle size of the scaly powder of the matrix is desirably 1 to 50% of the average size of the graphite powder to be used. Meanwhile, as the scaly graphite powder, one described in the first embodiment can be used in step (1).

When the scaly powder of aluminium or an alloy thereof is used, it is desirable to use a scaly powder of aluminium or an alloy thereof having an average particle size as large as possible in such a range that the graphite powder can be filled into the metal. This is because, in an ordinary case, the surface of the scaly powder of aluminium is oxidized. The oxide in the powder surface cannot be removed during the sintering, and thus remains in the aluminium matrix in the composite material. Accordingly, the oxide may serve as a factor to inhibit thermal conduction. To reduce this influence, it is important to use a powder having a surface area as small as possible, thereby to reduce the amount of the oxide remaining in the aluminium matrix. The average particle size of the scaly powder of aluminium or an alloy thereof is particularly desirably around 30 to 50% of the average size of the graphite powder to be used.

When copper or an alloy thereof is used, it is not necessary to consider the factor described above for the case of aluminium. However, since the difference in specific gravity between copper or an alloy thereof and graphite is large, segregation from each other is likely to occur in the obtained composite material. In order to prevent the segregation, when the scaly powder of copper or an alloy thereof is used, the average particle size thereof is desirably small as much as possible. Specifically, the average particle size of the scaly powder of copper or an alloy thereof is particularly desirably around 1 to 50% of the average size of the graphite powder to be used.

The scaly graphite powder can be mixed with the scaly powder of the matrix by using any means known in the art. For example, the powder mixture can be obtained by adding an inactive liquid medium to the scaly graphite powder and the scaly powder of the matrix, mixing together using a planetary ball mill or the like, and then removing the liquid medium using a dryer or the like.

The mixing ratio of the scaly graphite powder to the scaly powder of the matrix is determined so that the scaly graphite powder in the composite material finally obtained can account for 20 to 80% by volume of the composite material. Meanwhile, the powder mixture of this embodiment may further include a carbon fiber or a carbon nanofiber.

In step (2), the sintering precursor is formed by use of the powder mixture obtained in step (1). It is desirable that the scaly graphite powder be highly oriented when step (2) is performed.

For example, step (2) may be performed by repeating the steps of:

(2a) filling the powder mixture into a mold; and (2b) uniaxially pressing the powder mixture thus filled.

Here, as the mold, any mold known in the art can be used. Although not essential, it is convenient to fill a sintering mold (for example, a combination of punches and a die used for pulse electric current sintering) used in step (3).

For the uniaxial pressing in step (2b), a pressure in the range of 5 to 150 MPa can be used. When uniaxially pressed in step (2b), the scaly surface of the scaly graphite powder is oriented so that the normal vector can be oriented in the pressurizing direction.

However, when a large amount of the powder mixture is filled at once, the sufficient orientation in step (2b) may not be achieved, and eventually the sufficient orientation of the scaly graphite powder in the sintered composite material may not be achieved. For this reason, it is desirable to limit the amount of the powder mixture to be filled in step (2a), thereby to achieve the sufficient orientation in step (2b). In the present invention, it is desirable that the thickness, in a direction of the uniaxial pressing in step (2b), of the sintering precursor obtained by a single sequence of steps (2a) and (2b) be 5 mm or smaller, and preferably 3 mm or smaller. When a composite material having a larger thickness is produced, aforementioned steps (2a) and (2b) are repeated an appropriate number of times to form a sintering precursor.

As an alternative method, the sintering precursor can be formed by pouring, into the mold, a slurry-like mixture formed from the powder mixture and a liquid medium, and by subsequently removing the liquid medium therefrom. In this method, the powder mixture is settled to the bottom portion of the mold due to the gravity and deposited one after another. At this point, normal vectors to the scaly surfaces of both the scaly graphite powder and the scaly powder of the matrix are oriented in a vertical direction. As a modification example of this method, so-called slip casting may be performed as follows. Specifically, an absorber, such as gypsum, for absorbing the liquid medium is placed to the bottom surface of the mold; thereby, the slurry-like mixture is poured into the mold and the liquid medium is removed at the same time.

Alternatively, the sintering precursor may be formed by the following steps:

(2c) forming a slurry by mixing the powder mixture with a liquid medium;

(2d) spreading the slurry on a substrate by a doctor blade method; and (2e) removing the liquid medium therefrom.

In step (2c), the powder mixture and liquid medium are mixed to prepare a slurry-like mixture. If necessary, a binder may be added. As the binder, a material known in the art, such as polyethylene glycol, ethyl cellulose, paraffin and glue, can be used. In order to reduce the influence of the binder on the thermal conductivity of the obtained composite material, it is desirable to use the minimum required amount of the binder.

Next, in step (2d), a predetermined amount of the slurry-like mixture is placed dropwise onto the substrate. The slurry-like mixture is spread on the substrate using a blade movable with a certain space kept from the substrate. In order to restrain the spreading of the slurry-like mixture in a horizontal direction, a substrate having a groove with a certain width may be used. The slurry-like mixture is placed dropwise in the groove, and the blade is moved in a direction in which the groove extends.

Finally, in step (2e), the liquid medium is removed by using any means known in the art, such as heating or depressurizing. Thus, the sintering precursor is obtained.

In this method, both the scaly graphite powder and the scaly powder of the matrix are oriented in such a manner that the normal vectors to the scaly surfaces of both the powders match with a normal vector to the substrate surface. Here, the thickness of the sintering precursor obtained through steps (2c) to (2e) needs to be 0.5 mm to 5 mm. When a thicker sintering precursor is needed, a plurality of sintering precursors obtained by repeating steps (2d) and (2e) multiple times are overlapped one another. Then, the sintering step of step (3) is performed.

In step (3), the sintering precursor obtained in step (2) is sintered, while uniaxially pressed, to thus form the composite material. In this step, a method such as a hot pressing method, a pulse electric current sintering (SPS) method, or a hot isostatic pressing sintering (HIP) method can be adopted.

In the hot pressing method, used is a mold including a die having a through hole and two punches that fit in the through hole. A sintering precursor is placed in the through hole of the die in such a manner that the scaly surfaces of the scaly graphite powder and the scaly powder of the matrix in step (2) are perpendicular to a direction of the pressurizing with the punches. Then, the sintering precursor is sandwiched with the two punches, and a pressure is applied thereto. Simultaneously, the entire mold is heated with heating means such as a heater to sinter the sintering precursor.

In the SPS method, a sintering precursor is placed in a mold including a die and two punches in the same manner as in the hot pressing method. A pulse current is passed through the sintering precursor via the two punches, and thereby the sintering is proceeded using a Joule heat generated in the sintering precursor.

When a sintering precursor formed by repeating steps (2a) and (2b) is sintered by any of the two method described above, a mold including a die having a through hole and one punch that fits the through hole may be used in steps (2a) and (2b), and then the sintering in step (3) may be conducted in combination with another punch that fits the through hole. In other words, the same mold can be used through steps (2) and (3).

When the sintering is performed by adopting either of the hot pressing method and the SPS method, the pressure inside the device is desirably lowered to 30 Pa or less. Moreover, in the uniaxial pressing with the punches, a pressure at 20 to 150 MPa is desirably used.

Meanwhile, when the HIP method is adopted, a sintering precursor is placed in a mold stretchable in a uniaxial direction. At this point, the sintering precursor is placed in such a manner that the scaly surfaces of the scaly graphite powder and the scaly powder of the matrix in step (2) are perpendicular to a direction in which the mold stretches. Then, the mold accommodating the sintering precursor is placed in a pressurizing container containing a pressurizing fluid. The pressurizing fluid is heated with heating means, and simultaneously, a pressure is applied to the pressurizing fluid to progress the sintering. The pressure applied to the pressurizing fluid is desirably in the range of 20 to 300 MPa.

Whichever the methods described above are adopted, when aluminium or an alloy based thereon is used as the matrix, the sintering is preferably performed in such a condition that the highest end-point temperature of the sintering precursor is in the range of 500° C. to 650° C. Meanwhile, when copper or an alloy based thereon is used as the matrix, the sintering is preferably performed in such a condition that the highest end-point temperature the sintering precursor is in the range of 800° C. to 1000° C.

The metal-graphite composite material produced by the method of the second embodiment of the present invention has a relative density of 95% or higher as in the case of the composite material of the first embodiment. Moreover, in the metal-graphite composite material of this embodiment, the ratio of the scaly graphite powder in which the normal vector to the scaly surface thereof is tilted at 20° or higher with respect to a direction vector of the uniaxial pressing in step (3) (corresponding to the normal vector to the readily heat-conducting surface of the composite material) is 15% or less relative to the whole amount of the scaly graphite powder.

EXAMPLES

Example 1

A copper powder used in this Example was a scaly powder having an average particle size of 5 μm and an average thickness of 200 nm. The average aspect ratio thereof was 25, and the true density was 8.93 g/cm$^3$. A graphite powder used in the present invention was a scaly powder having an average particle diameter of 300 μm and an average thickness of 10 μm. The aspect ratio thereof was 30, and the true density was 2.27 g/cm$^3$. The crystallinity of the graphite powder was evaluated by performing the Gakushin method on a sample mixed with 20% by weight of an internal standard silicon powder. As a result, it was revealed that the $d_{002}$ of the graphite powder was 0.3347 nm, and thus the graphite powder had a high crystallinity.

Into a planetary ball mill were added 80.2 g of the copper powder, 19.8 g of the graphite powder, 30 g of ethanol, and 300 g of SUS balls having a diameter of 10 mm. The mixing was performed for 10 minutes with the planetary ball mill under conditions at the number of base rotations (number of revolutions) of 150 rpm and a speed ratio of −2.5 ("−" sign indicates the rotations in a direction opposite to the base rotations). A powder mixture thus obtained was taken out from the planetary ball mill and then air-dried for one day. Thereafter, the mixture was dried with a hot air dryer set at 70° C. for one hour.

The obtained powder mixture was sintered by a pulse electric current sintering method. A graphite dice having a 20-mm-square through hole was filled with 4 g to 5 g of the powder mixture, and a pressure at approximately 20 MPa was applied to thereby compact the powders. By a single filling/compacting step, a compact having a thickness of 3 mm was obtained. This filling/compacting step was repeated 10 times to obtain a sintering precursor having a thickness of 30 mm in the pressurizing direction. Then, the pressure inside a device for pulse electric current sintering was lowered to 30 Pa or less. A pressure at 50 PMa (a pressing force of 20 kN) was applied to the sintering precursor, and a current having a pulse width of 0.5 ms, a frequency of 375 Hz and a current density of 1000 A/cm² was passed therethrough for 10 minutes for sintering. The highest end-point temperature at this time was 900° C., and the time to retain the highest end-point temperature was set to 5 minutes. By the sintering, a composite material having a dimension of 20×20×20 mm was obtained. The volume percent (Vf) of the graphite powder in the composite material was 50%.

Table 1 shows the measurement results of the relative density, thermal conductivity and thermal expansion coefficient of the obtained composite material. Note that, in Table 1, a Z direction is the pressurizing direction during the sintering, and X and Y directions are two directions perpendicular to the Z direction.

Moreover, FIG. 1 shows a photograph of a sectional structure of the obtained composite material. By observing this photograph of the sectional structure, the orientation of the graphite powder in the composite material was evaluated. An XZ cross section of the composite material was prepared. A grid was assumed, which consists of 10 lines each having a length of 0.5 mm extending in the Z direction and 10 lines each having a length of 0.5 mm extending in the X direction. Angles were measured between the Z axis and normal vectors to scaly surfaces of the graphite powder, for the graphite powders which were present at 100 line intersections in the grid. Table 1 shows the evaluation result.

Example 2

A composite material was produced by repeating the procedure in Example 1 except that 73.0 g of the copper powder and 27.0 g of the graphite powder were used when a powder mixture was prepared. The Vf of the obtained composite material was 60%.

Figure 2:
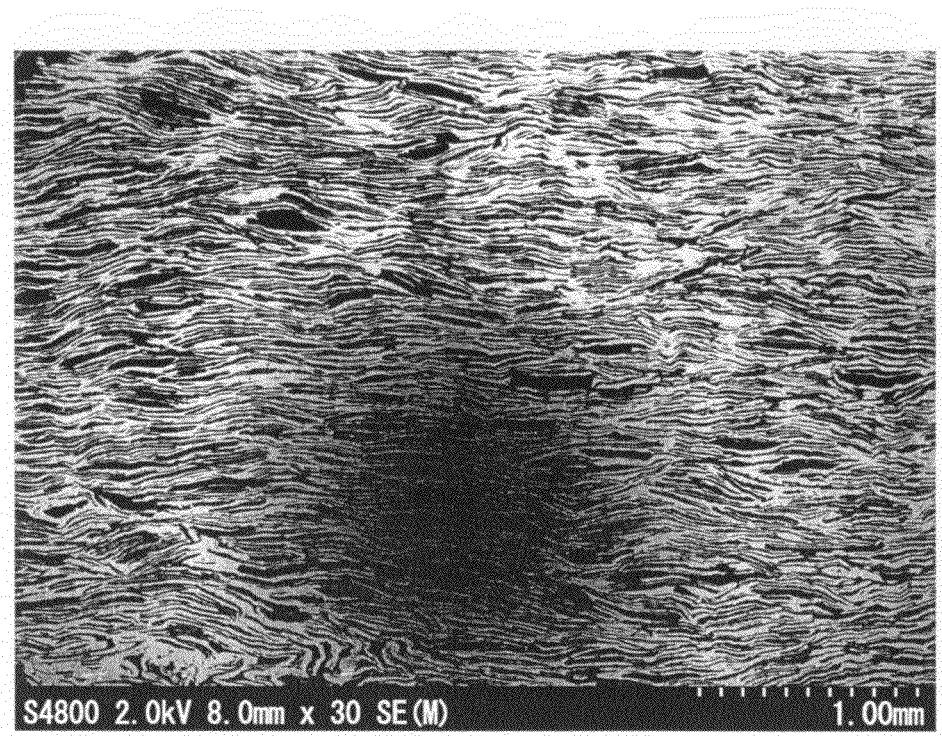
FIG. 2 is a view showing a photograph of a sectional structure of a composite material obtained in Example 2.

FIG. 2 shows a photograph of a sectional structure of the obtained composite material. Table 1 shows the result of evaluation on the orientation of the graphite powder in the composite material, the evaluation made by observing this photograph of the sectional structure. Table 1 also shows the measurement results of the relative density, thermal conductivity and thermal expansion coefficient of the obtained composite material.

Example 3

A composite material was produced by repeating the procedure in Example 1 except that 63.4 g of the copper powder and 36.6 g of the graphite powder were used when a powder mixture was prepared. The Vf of the obtained composite material was 70%. Table 1 shows the measurement results of the relative density, thermal conductivity and thermal expansion coefficient of the obtained composite material.

Example 4

A composite material was formed by repeating the procedure in Example 1 except for the following points.

An aluminum powder having an average particle diameter of 30 μm, an average thickness of 1 μm and an aspect ratio of 30 was used instead of the copper powder. When a powder mixture was prepared, 36.4 g of the aluminum powder and 22.7 g of the graphite powder were used. The pulse electric current sintering method was performed, following the same procedure as in Example 1 except that the current density was changed to 750 A/cm², and that the retention time at the highest end-point temperature was changed to 0 minutes. Thus, a composite material was produced.

In this Example, the end-point temperature in the pulse electric current sintering was 625° C. Moreover, the Vf of the obtained composite material was 50%. Table 1 shows the measurement results of the relative density, thermal conductivity and thermal expansion coefficient of the obtained composite material.

Example 5

A composite material was produced by repeating the procedure in Example 4 except that 29.7 g of the aluminum powder and 27.7 g of the graphite powder were used when a powder mixture was prepared. The Vf of the obtained composite material was 60%. Table 1 shows the measurement results of the relative density, thermal conductivity and thermal expansion coefficient of the obtained composite material.

Example 6

A composite material was produced by repeating the procedure in Example 4 except that 22.7 g of the aluminum powder and 33.0 g of the graphite powder were used when a powder mixture was prepared. The Vf of the obtained composite material was 70%. Table 1 shows the measurement results of the relative density, thermal conductivity and thermal expansion coefficient of the obtained composite material.

Example 7

A green sheet was prepared by the doctor blade method using the same copper powder and graphite powder as those in Example 1.

Into a planetary ball mill were added 65.0 g of the copper powder, 11.0 g of the graphite powder, 25 g of ethanol, and 300 g of SUS balls having a diameter of 10 mm. The mixing was performed for 10 minutes with the planetary ball mill under conditions at the number of base rotations (the number of revolutions) of 150 rpm and a speed ratio of −2.5 ("−" sign indicates the rotations in a direction opposite to the base rotations). The SUS balls were removed, and a slurry was obtained.

An application mixture was obtained by adding 6 g of polyethylene glycol (molecular weight: 300) to 200 g of the obtained slurry. This application mixture was poured between blocks having a height of 2 mm and being placed on a substrate at an interval of 70 mm. The aluminium doctor blade was slid on the blocks, and subsequently the slurry between the blocks was dried. Thereby, a green sheet having a width of 70 mm, a length of 300 mm and a thickness of 2 mm was obtained.

The obtained green sheet was cut into pieces each having a length of 70 mm. The green sheet having a width of 70 mm×a length of 70 mm×a thickness of 2 mm was placed in a graphite dice having a 70-mm-square through hole, and sintered by the pulse electric current sintering method employing the same conditions as in Example 1. A composite material thus obtained had a dimension of a width of 70 mm×a length of 70 mm×a thickness of 0.5 mm, and a Vf of 40%. Table 1 shows the measurement results of the relative density, thermal conductivity and thermal expansion coefficient of the obtained composite material.

Comparative Example 1

In accordance with the same procedure as in Example 1, a powder mixture was prepared. The obtained powder mixture was molded by uniaxially pressing with a pressure of 50 MPa. Thereby, a disc-shaped powder compact having a diameter of 20 mm and a thickness of 5 mm was obtained. The obtained powder compact was placed in a vacuum furnace. The pressure inside the vacuum furnace was lowered to 30 Pa or less, and pressureless sintering was performed thereon with heating to 900° C. for one hour. A composite material thus obtained had a disc shape with a diameter of 20 mm and a thickness of 5 mm. The Vf of the obtained composite material was 50%. Table 1 shows the measurement results of the relative density, thermal conductivity and thermal expansion coefficient of the obtained composite material. Note that, a Z direction in this Comparative Example is the pressurizing direction during the uniaxial pressing molding.

Comparative Example 2

A composite material was produced by repeating the procedure in Example 2 except that the amount of the powder mixture filled into the graphite dice for each filling was changed to 20 g. The Vf of the obtained composite material was 60%.

Figure 3:
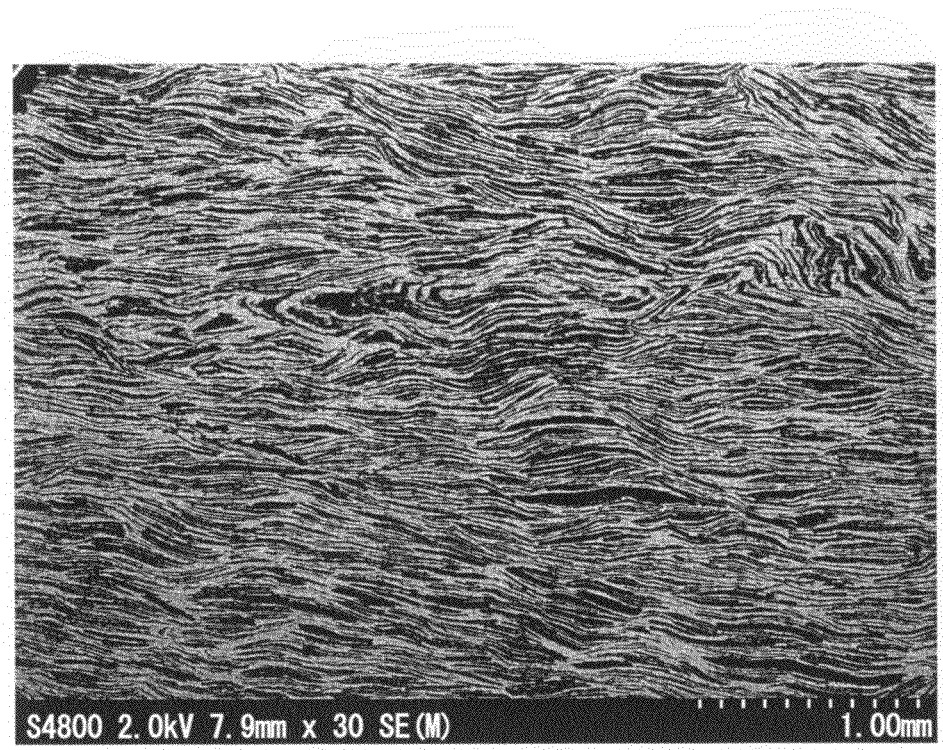
FIG. 3 is a view showing a photograph of a sectional structure of a composite material obtained in Comparative Example 2.

FIG. 3 shows a photograph of a sectional structure of the obtained composite material. Table 1 shows the result of evaluation on the orientation of the graphite powder in the composite material, the evaluation made by observing this photograph of the sectional structure. Table 1 also shows the measurement results of the relative density, thermal conductivity and thermal expansion coefficient of the obtained composite material.

Comparative Example 3

A composite material was produced by repeating the procedure in Example 1 except that a spherical copper powder prepared by an atomization method was used instead of the scaly copper powder. The Vf of the obtained composite material was 50%.

Figure 4:
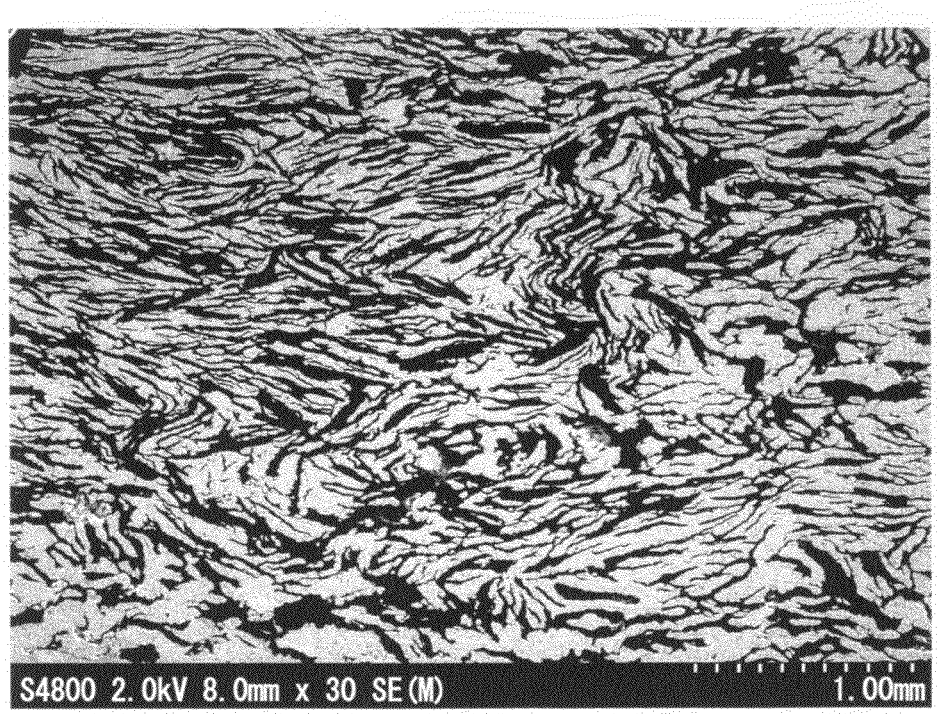
FIG. 4 is a view showing a photograph of a sectional structure of a composite material obtained in Comparative Example 3.

FIG. 4 shows a photograph of a sectional structure of the obtained composite material. Table 1 shows the result of evaluation on the orientation of the graphite powder in the composite material, the evaluation made by observing this photograph of the sectional structure. Table 1 also shows the measurement results of the relative density, thermal conductivity and thermal expansion coefficient of the obtained composite material.

TABLE 1

Evaluations of composite materials

| Matrix (Shape)*1 | Graphite volume ratio (%) | Density (g/cm³) | Relative density (%) | Thermal conductivity (W/m/K) XY*2 | Z*2 | Thermal expansion coefficient (ppm/K) XY*2 | Z*2 | Orientation of graphite powders ≦10° | >10° but ≦20° | >20° but ≦30° | >30° |
|---|---|---|---|---|---|---|---|---|---|---|---|
| Example 1 | Cu(Sc) | 50 | 5.39 | 96.3 | 560 | 48 | 11.5 | 9.9 | 69 | 26 | 3 | 2 |
| Example 2 | Cu(Sc) | 60 | 4.88 | 99.1 | 575 | 41 | 10.3 | 18.9 | 59 | 34 | 5 | 1 |
| Example 3 | Cu(Sc) | 70 | 4.13 | 97.0 | 549 | 42 | 6 | 15.5 | 60 | 30 | 8 | 2 |
| Example 4 | Al(Sc) | 50 | 2.45 | 98.4 | 453 | 37 | 17.3 | 8.1 | 61 | 33 | 5 | 1 |
| Example 5 | Al(Sc) | 60 | 2.39 | 97.6 | 489 | 38 | 12.7 | 6.2 | 67 | 30 | 2 | 1 |
| Example 6 | Al(Sc) | 70 | 2.35 | 97.5 | 518 | 39 | 10 | 6.9 | 55 | 40 | 5 | 0 |
| Example 7 | Cu(Sc) | 40 | 6.01 | 96.2 | — | — | — | — | 56 | 32 | 10 | 2 |
| Comparative Example 1 | Cu(Sc) | 50 | 3.02 | 54.1 | — | — | 5.2 | — | — | — | — | — |
| Comparative Example 2 | Cu(Sc) | 60 | 4.76 | 96.8 | 428 | 49 | 3.5 | 15.9 | 52 | 32 | 9 | 7 |
| Comparative Example 3 | Cu(Sp) | 50 | 5.41 | 96.9 | 380 | 51 | — | — | 19 | 36 | 17 | 28 |

*1Sc: scaly, Sp: spherical
*2Z: pressurizing direction, XY: directions perpendicular to pressurizing direction From the above results, all of the composite materials obtained in Examples 1 to 6 showed a relative density higher than 95%, which reveals that few voids were present in the composite materials. In contrast, in Comparative Example 1 where the pressureless sintering was performed after the uniaxial pressing molding, the relative density was 54.1%, which reveals that quite a number of voids were present in the composite material. Although the composite material of Comparative Example 1 showed a low thermal expansion coefficient (5.2 ppm/K) in the XY directions because of the presence of the voids, the thermal conductivity thereof (particularly, in the XY directions) was low compared with that of the composite material in each Example.

Moreover, in the evaluation on the orientation of the graphite powder, the ratio of the graphite powder in which the normal vector to the scaly surface thereof was tilted at an angle higher than 20° was 12% or less in the composite materials of Examples 1 to 6. In this way, the scaly surface of the graphite powder was aligned along the XY plane in the composite materials of Examples 1 to 6, which thereby showed a high thermal conductivity in the plane vertical to the pressurizing direction (that is, in the XY directions), and simultaneously showed a low thermal conductivity in the pressurizing direction (Z direction). In contrast, in Comparative Example 2 where the filling amount at each filling in the compacting step was increased, although the relative density was equivalent to those of the composite materials of Examples, the ratio of the graphite powder in which the normal vector to the scaly surface thereof was tilted at an angle higher than 20° was 16%. Due to this disorder in alignment, the thermal conductivity in the XY directions of the composite material of Comparative Example 2 was lowered. Furthermore, in Comparative Example 3 where the spherical copper powder was used instead of the scaly copper powder, the ratio of the graphite powder in which the normal vector to the scaly surface thereof was tilted at an angle higher than 20° was 45%. Consequently, the thermal conductivity in the XY directions of the composite material was significantly lowered.

Example 8

Metal-graphite composite materials were each formed using a short carbon fiber (Chopped Carbon Fiber, hereinafter, referred to as CCF) having a diameter of 10 μm and a length of 3 mm in addition to the copper powder and the graphite powder used in Example 1 and the aluminium powder used in Example 4. The mixing and sintering of the materials used were performed by adopting the same procedure as in Example 1.

In this Example, the total amount of the graphite powder and the CCF was fixed to 50% by volume, but the blending ratio of the graphite powder to the CCF was varied. The density, relative density, thermal conductivity, thermal expansion coefficient, and bending strength of each obtained material were measured. The bending strength was measured by a three-point bending test in which a sample having dimensions of 3 mm×2 mm×20 mm was supported at two fulcrums with a span therebetween of 16 mm, and then a weight was applied to a central portion between the two fulcrums at a speed of 0.5 mm/minute. Table 2 shows the obtained results.

TABLE 2

Evaluation of composite materials of Example 8

| Sample | Density (g/cm$^3$) | Relative density (%) | Thermal conductivity (W/m/k) | | Thermal expansion coefficient (ppm/° C.) | | Bending strength (Mpa) |
|---|---|---|---|---|---|---|---|
| | | | XY*$^1$ | Z*$^1$ | XY*$^1$ | Z*$^1$ | |
| Cu-50Gr | 5.39 | 96.3 | 560 | 48.1 | 11.5 | 9.9 | 67.8 |
| Cu-10CCF-40Gr | 5.38 | 96.6 | 512.6 | 64 | 5.6 | 134 | 92.2 |
| Cu-20CCF-30Gr | 5.38 | 96.9 | 457.1 | 64.9 | 8.1 | 10.1 | 83.8 |
| Al-50Gr | 2.45 | 98.4 | 452.8 | 37.4 | 17.3 | 8.1 | 65.2 |
| Al-10CCF-40Gr | 2.40 | 96.4 | 381.9 | 41.8 | 12.6 | 8.4 | 65.5 |
| Al-20CCF-30Gr | 2.38 | 96.1 | 366.9 | 42.9 | 10.8 | 15.9 | 68.6 |

*$^1$Z: pressurizing direction, XY: directions perpendicular to pressurizing direction In Table 2, "Cu-10CCF-40Gr" represents a composite material produced from raw materials including 10% by volume of a CCF, 40% by volume of a graphite powder and the balance of Cu. Moreover, regarding the thermal conductivity and thermal expansion coefficient, a Z direction is the pressurizing direction during the sintering, and X and Y directions are two directions perpendicular to the Z direction.

As apparent from Table 2, the thermal conductivity was lowered slightly as the amount of the CCF added was increased. However, it is found out that the bending strength of a composite material based on Cu was significantly increased. Moreover, it is recognized that the bending strength of a composite material based on Al was increased in some degree.

Figure 5:
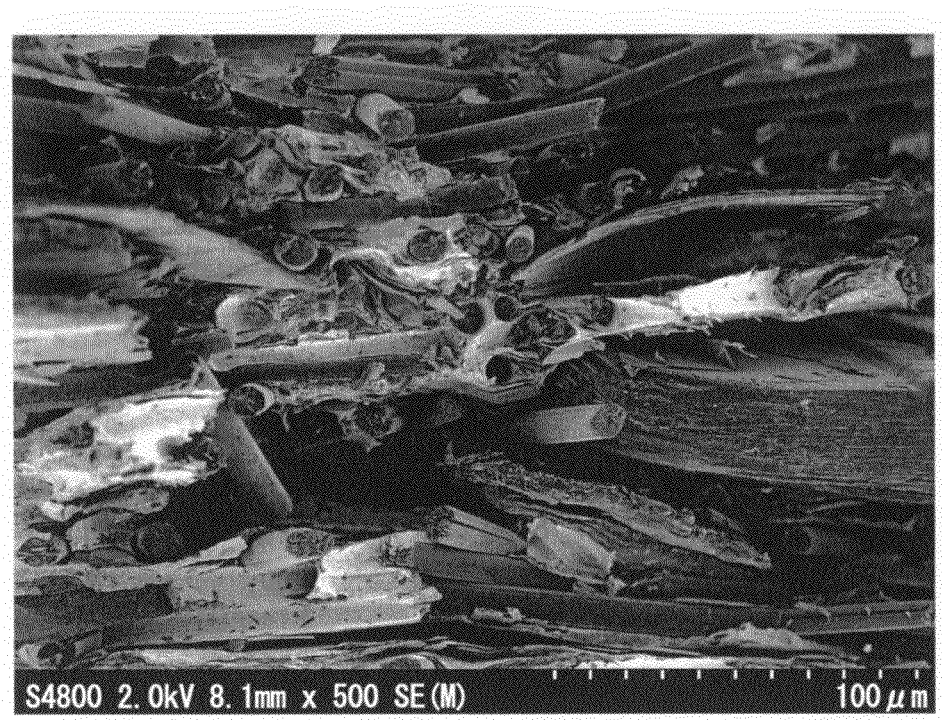
FIG. 5 is a view showing a photograph of a sectional structure of a fractured surface of Cu-10CCF-40Gr obtained in Example 8.
Figure 6:
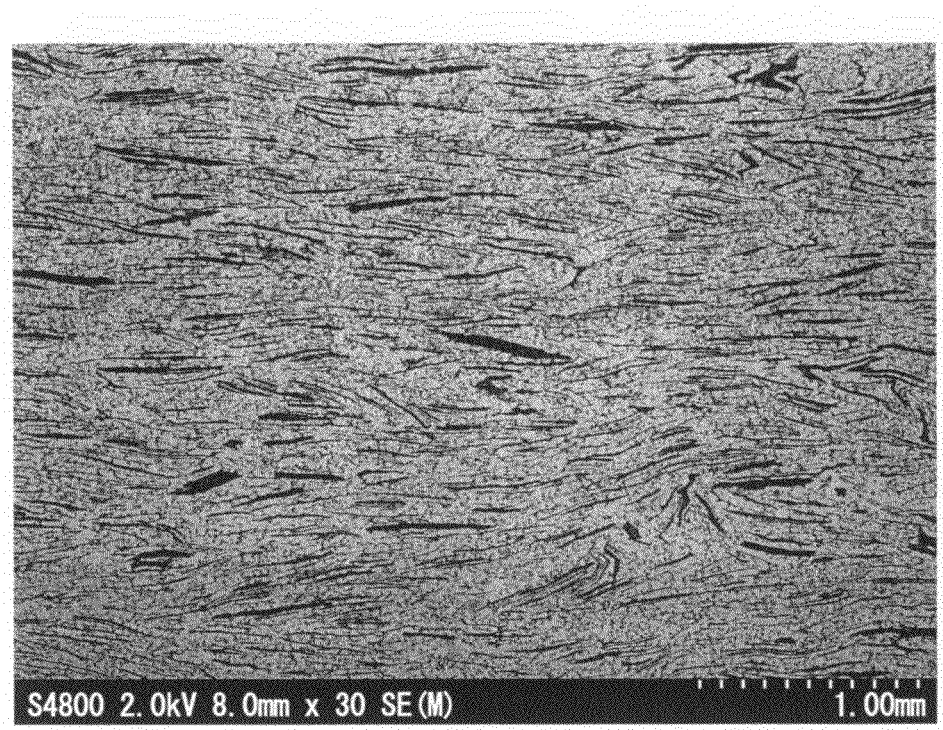
FIG. 6 is a view showing a photograph of a sectional structure of a polished surface of the Cu-10CCF-40Gr obtained in Example 8.
Figure 7:
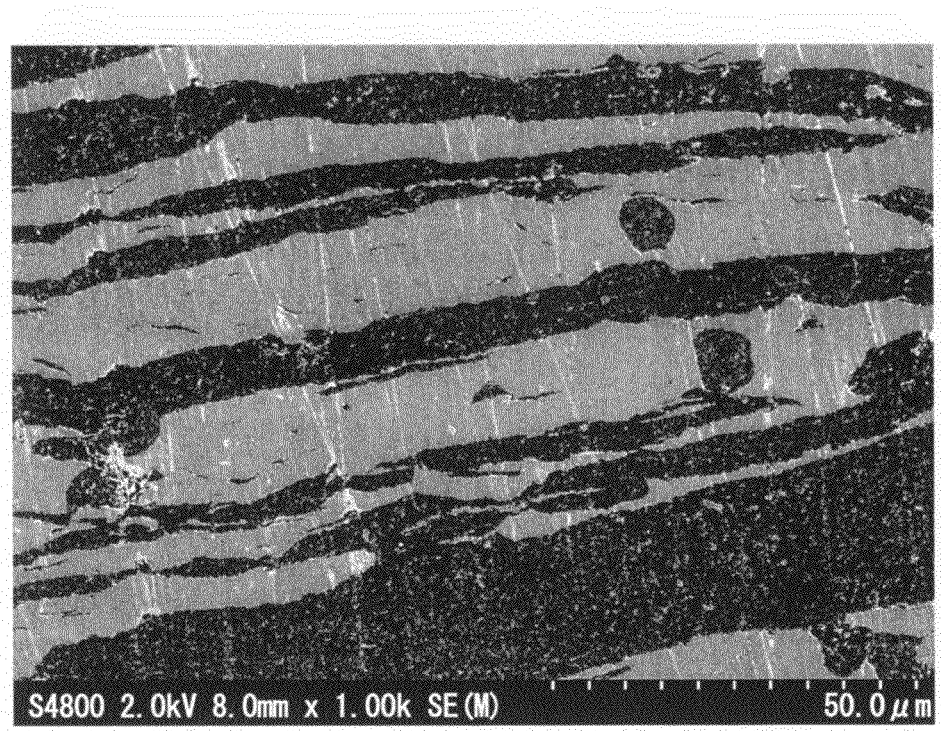
FIG. 7 is a view showing a photograph of the sectional structure of the polished surface of the Cu-10CCF-40Gr obtained in Example 8.

Next, the Cu-10CCF-40Gr was fractured at an XZ plane thereof. The fractured surface and a polished surface obtained after the fractured surface was polished were observed. FIG. 5 shows a photograph (500 times) of a sectional structure of the fractured surface of the Cu-10CCF-40Gr. FIG. 6 shows a photograph (30 times) of a sectional structure of the polished surface of the Cu-10CCF-40Gr. FIG. 7 shows a photograph (1000 times) of the sectional structure of the polished surface of the Cu-10CCF-40Gr.

In FIG. 5, it is seen that the scaly graphite powder was fractured at the fractured surface. In contrast, some of the CCF protruded from the fractured surface, and some of the CCF was pulled off from the fractured surface. This revealed that the CCF contributed to the improvement in bending strength of the composite material.

As seen from FIG. 6 and FIG. 7, the scaly graphite powders were arranged substantially in the XY plane. Moreover, in FIG. 7, it is seen that a sectional structure of the CCF with a diameter of approximately 10 μm was present in the matrix metal between the scaly graphite powders, and that the CCF was randomly oriented in the XY plane.

Example 9

In this Example, properties of composite materials obtained by using matrix metal powders of different shapes were evaluated. A scaly copper powder used in this Example had an average particle diameter of approximately 50 μm and an average aspect ratio of approximately 30. Moreover, a spherical copper powder used in this Example was prepared by a water atomization method, and had an average particle diameter of approximately 40 μm. Furthermore, in this Example, a scaly graphite powder having an average particle diameter of 300 μm and an average thickness of 10 nm was used.

Two kinds of the composite materials were produced each using 70% by volume of a copper powder and 30% by volume of the scaly graphite powder. On the one hand, only the scaly copper powder was used as the copper powder. On the other hand, a mixture of 40% by volume of the scaly copper powder with 60% by volume of the spherical copper powder was used as the copper powder. The composite materials were produced by adopting the procedure in Example 1.

Figure 8:
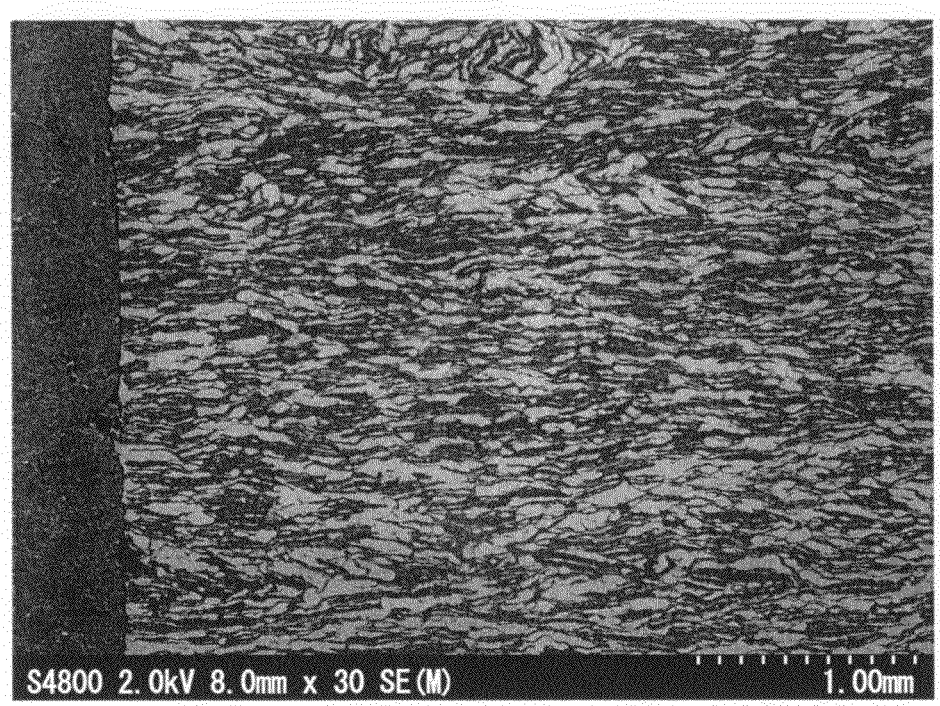
FIG. 8 is a view showing a photograph of a sectional structure of a sample 2 of Example 9.

The obtained two kinds of the composite materials were evaluated in terms of the density, relative density, thermal conductivity, thermal expansion coefficient, bending strength and orientation state of the graphite powder thereof. Table 3 shows the results. Moreover, FIG. 8 shows a photograph of a sectional structure of the composite material produced using the mixture of the scaly copper powder with the spherical copper powder.

TABLE 3

Evaluation of composite materials of Example 9

| | Copper powder | | | | Thermal conductivity (W/m/K) | | Thermal expansion coefficient (ppm/K) | | Bending strength | Orientation of graphite powder | | | |
|---|---|---|---|---|---|---|---|---|---|---|---|---|---|
| | (% by volume) | | Density | Relative density | | | | | | | >10° but | >20° but | |
| Sample | Sc | Sp | (g/cm³) | (%) | XY*¹ | Z*¹ | XY*¹ | Z*¹ | (Mpa) | ≦10° | ≦20° | ≦30° | >30° |
| 1 | 100 | 0 | 4.13 | 97.1 | 631.6 | 35.2 | 6.7 | 9.4 | 53.5 | 55 | 40 | 5 | 0 |
| 2 | 40 | 60 | 4.15 | 97.5 | 570.1 | 34.4 | 9.8 | 15.2 | 26.0 | 48 | 34 | 14 | 4 |

Sc: Scaly,
Sp: Spherical
*¹Z: pressurizing direction, XY: directions perpendicular to pressurizing direction As seen from Table 3, in a sample 2 obtained by using the mixture of the scaly copper powder and the spherical copper powder, the ratio of the graphite powder which was arranged to be tilted at 20° or higher with respect to the XY plane was increased to 18%. In other words, it was revealed that the use of the spherical copper powder caused the disorder in orientation of the graphite powder. Due to this disorder in orientation, the thermal conductivity (570.1 W/m/K) in the XY plane of the sample 2 was lowered by approximately 10%, compared with the thermal conductivity (631.6 W/m/K) of a sample 1 obtained by using only the scaly copper powder. Furthermore, the bending strength (26 MPa) of the sample 2 obtained by using the spherical copper powder was approximately half of the bending strength (53.5 MPa) of the sample 1 obtained by using only the scaly copper powder. This revealed that the disorder in orientation of a graphite powder adversely affects the mechanical strength of a composite material.

The invention claimed is:

1. A metal-graphite two-dimensionally thermally-conductive composite material comprising: 20 to 80% by volume of a scaly graphite powder; and a matrix selected from the group consisting of copper, aluminium and alloys thereof, wherein
   the scaly graphite powder in which a normal vector to a scaly surface is tilted at 20° or higher with respect to a normal vector to a readily heat-conducting surface of the metal-graphite two-dimensionally thermally-conductive composite material is 12% or less relative to a whole amount of the scaly graphite powder,
   the scaly graphite powder in which a normal vector to a scaly surface is tilted at 10° or less with respect to a normal vector to the readily heat-conducting surface is 55% or more relative to a whole amount of the scaly graphite powder, and
   the metal-graphite two-dimensionally thermally-conductive composite material has a relative density of 95% or higher.

2. The metal-graphite two-dimensionally thermally-conductive composite material according to claim 1, wherein the scaly graphite powder has a d002 value of a graphite crystal in a range of 0.3345 nm to 0.3360 nm as measured by X-ray diffraction.

3. The metal-graphite two-dimensionally thermally-conductive composite material according to claim 1, wherein the scaly graphite powder has an average aspect ratio of 10 to 100.

4. The metal-graphite two-dimensionally thermally-conductive composite material according to claim 1, wherein the scaly graphite powder has an average particle size of 50 μm to 1000 μm.

5. The metal-graphite two-dimensionally thermally-conductive composite material according to claim 1, further comprising any one of a carbon fiber and a carbon nanofiber.

6. A production method for a metal-graphite two-dimensionally thermally-conductive composite material, comprising the steps of:
   (1) obtaining a powder mixture by mixing a scaly graphite powder with a scaly powder of a matrix selected from the group consisting of copper, aluminium and alloys thereof;
   (2) forming a sintering precursor by use of the powder mixture; and
   (3) sintering the sintering precursor with uniaxial pressing being performed, wherein
   step (3) is carried out by a method selected from the group consisting of a hot pressing method, a pulse electric current sintering method, and a hot isostatic pressing sintering method in combination with a mold stretchable in a uniaxial direction;
   the scaly graphite powder accounts for 20 to 80% by volume of the metal-graphite two-dimensionally thermally-conductive composite material,
   the metal-graphite two-dimensionally thermally-conductive composite material has a relative density of 95% or higher, and
   a ratio of the scaly graphite powder in which a normal vector to a scaly surface is tilted at 20° or higher with respect to a direction vector of the uniaxial pressing in step (3) is 12% or less relative to a whole amount of the scaly graphite powder, and the scaly graphite powder in which a normal vector to a scaly surface is tilted at 10° or less with respect to a normal vector to the readily heat-conducting surface is 55% or more relative to a whole amount of the scaly graphite powder.

7. The production method for a metal-graphite two-dimensionally thermally-conductive composite material according to claim 6, wherein the scaly graphite powder has a d002 value of a graphite crystal in a range of 0.3345 nm to 0.3360 nm as measured by X-ray diffraction.

8. The production method for a metal-graphite two-dimensionally thermally-conductive composite material according to claim 6, wherein
the scaly graphite powder has an average aspect ratio of 10 to 100, and
the scaly powder of the matrix has an average aspect ratio of 10 to 100.

9. The production method for a metal-graphite two-dimensionally thermally-conductive composite material according to claim 6, wherein the scaly graphite powder has an average particle size of 50 μm to 1000 μm.

10. The production method for a metal-graphite two-dimensionally thermally-conductive composite material according to claim 6, further comprising the step of adding any one of a carbon fiber and a carbon nanofiber to the powder mixture.

11. The production method for a metal-graphite two-dimensionally thermally-conductive composite material according to claim 6, wherein
step (2) is performed by repeating, one or more times, steps of:
(2a) filling the powder mixture into a mold; and
(2b) uniaxially pressing the powder mixture thus filled, and
a thickness, in a direction of the uniaxial pressing in step (2b), of the sintering precursor obtained by a single sequence of steps (2a) and (2b) is 5 mm or smaller.

12. The production method for a metal-graphite two-dimensionally thermally-conductive composite material according to claim 6, wherein
step (2) is performed by steps of:
(2c) forming a slurry by mixing the powder mixture with a liquid medium;
(2d) spreading the slurry on a substrate by a doctor blade method; and
(2e) removing the liquid medium therefrom, and
a thickness of a sintering precursor obtained through steps (2c) to (2e) is 5 mm or smaller.

13. A metal-graphite two-dimensionally thermally-conductive composite material produced by the production method according to claim 6.

14. A metal-graphite two-dimensionally thermally-conductive composite material produced by the production method according to claim 7.

15. A metal-graphite two-dimensionally thermally-conductive composite material produced by the production method according to claim 8.

16. A metal-graphite two-dimensionally thermally-conductive composite material produced by the production method according to claim 9.

17. A metal-graphite two-dimensionally thermally-conductive composite material produced by the production method according to claim 10.

18. A metal-graphite two-dimensionally thermally-conductive composite material produced by the production method according to claim 11.

19. A metal-graphite two-dimensionally thermally-conductive composite material produced by the production method according to claim 12.

* * * * *